United States Patent
Tao et al.

(10) Patent No.: US 9,632,708 B2
(45) Date of Patent: Apr. 25, 2017

(54) METHOD, APPARATUS, AND SYSTEM FOR READING AND WRITING DATA

(71) Applicant: Huawei Technologies Co., Ltd., Shenzhen, Guangdong (CN)

(72) Inventors: Yidong Tao, Shanghai (CN); Shaojie Chen, Hangzhou (CN); Yiping Dai, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 21 days.

(21) Appl. No.: 14/933,785

(22) Filed: Nov. 5, 2015

(65) Prior Publication Data
US 2016/0054919 A1 Feb. 25, 2016

Related U.S. Application Data

(63) Continuation of application No. PCT/CN2013/088452, filed on Dec. 3, 2013.

(30) Foreign Application Priority Data

May 9, 2013 (CN) .......................... 2013 1 0169197

(51) Int. Cl.
G06F 12/00 (2006.01)
G06F 3/06 (2006.01)
(Continued)

(52) U.S. Cl.
CPC ............ G06F 3/061 (2013.01); G06F 3/0629 (2013.01); G06F 3/0679 (2013.01);
(Continued)

(58) Field of Classification Search
CPC ...... G06F 3/061; G06F 3/0629; G06F 3/0679; G11C 13/1668; G11C 13/0004; G11C 13/004; G11C 13/0069; G11C 16/00
See application file for complete search history.

(56) References Cited

U.S. PATENT DOCUMENTS

2009/0094405 A1  4/2009  Kim et al.
2011/0119429 A1  5/2011  Tu et al.
(Continued)

FOREIGN PATENT DOCUMENTS

CN  102043591 A  5/2011
CN  102063266 A  5/2011
(Continued)

OTHER PUBLICATIONS

Byung-Do Yang, et al., "A Low Power Phase-Change Random Access Memory using a Data-Comparison Write Scheme", IEEE, 2007, p. 3014-3017.
Liu Jinlei, et al., "Application Research on New Non-Volatile Phase Change Memory PCM", Journal of Computer Research and Development, 2012, p. 90-93.
(Continued)

*Primary Examiner* — Shawn X Gu

(57) ABSTRACT

Embodiments of the present invention provide a method, an apparatus, and a system for reading and writing data, which relate to the computer field, can resolve a problem in the prior art that different algorithms need to be configured for write operations on storage devices of different optimization granularities. The method includes: acquiring first data to be written into a storage device and an address for the first data; acquiring, second data from the address of the storage device; acquiring configuration information; generating, according to the configuration information, a candidate data set; comparing data in the candidate data set with the second data, so as to acquire third data that is in the candidate data set and meets a preset rule; and writing the third data into the storage device according to the address.

18 Claims, 6 Drawing Sheets

(51) Int. Cl.
  *G11C 16/00* (2006.01)
  *G11C 13/00* (2006.01)
  *G06F 13/16* (2006.01)
(52) U.S. Cl.
  CPC ...... *G06F 13/1668* (2013.01); *G11C 13/0004* (2013.01); *G11C 13/004* (2013.01); *G11C 13/0069* (2013.01); *G11C 16/00* (2013.01)

(56) References Cited

U.S. PATENT DOCUMENTS

2011/0252206 A1  10/2011  Pyeon
2012/0144249 A1  6/2012  Franceschini et al.

FOREIGN PATENT DOCUMENTS

CN  102097125 A  6/2011
CN  102253901 A  11/2011
CN  102844813 A  12/2012

OTHER PUBLICATIONS

Tian Yulong, "Shift-Min-Write: a mechanism for reducing write operations in PRAM", vol. 6, No. 1, Jan. 2011, p. 10-14.
Sangyeun Cho et al., "Flip-N-Write: A Simple Deterministic Technique to Improve PRAM Write Performance, Energy and Endurance", MICRO '09, Dec. 12-16, 2009, 11 pages.

METHOD, APPARATUS, AND SYSTEM FOR READING AND WRITING DATA

CROSS-REFERENCE TO RELATED APPLICATION

This application is a continuation of International Application No. PCT/CN2013/088452, filed on Dec. 3, 2013, which claims priority to Chinese Patent Application No. 201310169197.7, filed on May 9, 2013, both of which are hereby incorporated by reference in their entireties.

TECHNICAL FIELD

The present invention relates to the computer field, and in particular, to a method, an apparatus, and a system for reading and writing data.

BACKGROUND

As a novel non-volatile memory, a PCM (Phase Change Memory, phase change memory) features low power consumption, low access delay, support for bitwise access, and the like. Therefore, the PCM become increasingly popular. However, the PCM can withstand a limited quantity of write times, generally $10^8$ to $10^{12}$ times. A service life of a PCM calculated according to an average frequency of use is approximately three years, which is shorter than that of a DRAM (Dynamic Random Access Memory, dynamic random access memory) or a disk. Therefore, people need to improve the service life of a PCM by reducing write times of the PCM.

In the prior art, the write times of a PCM can be reduced by using a DCW (Data-Comparison Write, data-comparison write) method. A basic idea behind DCW is as follows: Before data is written into a PCM, original data is read from the PCM and compared with the to-be-written data, and only different data bits are written into the PCM, so that a smallest quantity of bits are changed during one write operation, thereby reducing the write times. On the basis of using DCW, people use different algorithms to convert the to-be-written data, so as to further reduce a quantity of data bits changed during one write operation. For example, the to-be-written data is converted into one piece of or more pieces of data, by using any one of or a combination of a negation algorithm, an exclusive NOR algorithm, an exclusive OR algorithm, a cyclic shift algorithm. Data with minimum difference to the original data is found from the converted data, and then the found data is written into the PCM.

However, a bit quantity of a data flag restricts a quantity of pieces of the converted data, and different algorithms need to be configured for different bit quantities of the data flag so as to perform data conversion. For example, when a bit quantity of the data flag is 1, the negation algorithm may be used; when a bit quantity of the data flag is $\log_2^N$ (N is a bit width of the to-be-written data), the cyclic shift algorithm may be used; when a bit quantity of the data flag is $\log_2^N+1$, the cyclic shift algorithm and the negation algorithm may be used in combination. Because different algorithms are required when bit quantities of the data flag are different, an inevitable consequence is that flexibility in performing an operation of writing data into the PCM is relatively low; in addition, it is difficult to configure corresponding algorithms for all bit quantities of the data flag.

SUMMARY

Embodiments of the present invention provide a method, an apparatus, and a system for reading and writing data, which can resolve a problem in the prior art that different algorithms need to be configured for write operations on storage devices of different optimization granularities, and improve flexibility of the write operations on storage devices.

To achieve the foregoing objective, the following technical solutions are used in the embodiments of the present invention:

According to a first aspect, an embodiment of the present invention provides a method for reading and writing data, including:

acquiring first data to be written into a storage device and an address for the first data;

acquiring, according to the address, second data that has been written into the storage device;

acquiring configuration information, where the configuration information includes a data bit width, a bit quantity of a data flag, and a preset stepping algorithm, and the data bit width indicates a bit width of the first data;

generating, according to the bit quantity of the data flag and the bit width of the first data and by using the preset stepping algorithm, a candidate data set corresponding to the first data, where each piece of data in the candidate data set is uniquely corresponding to a value of one data flag;

comparing data in the candidate data set with the second data, so as to acquire third data that is in the candidate data set and meets a preset rule; and writing the third data into the storage device according to the address, so as to calculate and read the first data according to the third data and a value of a data flag corresponding to the third data, when the first data needs to be read from the storage device.

In a first possible implementation manner of the first aspect, the generating, according to the bit quantity of the data flag and the bit width of the first data and by using the preset stepping algorithm, a candidate data set corresponding to the first data includes:

determining the bit quantity T of the data flag and the bit width N of the first data;

obtaining a step $2^{N-T+1}-1$ by means of calculation according to the bit quantity T of the data flag and the bit width N of the first data, where N is a natural number, and T is a natural number; and generating the candidate data set corresponding to the first data, where the candidate data set is M={m|m=U+($2^{N-T+1}$)*I, I=[0, $2^T-1$]}, U is the first data, and I indicates a value of the data flag.

With reference to the first possible implementation manner of the first aspect, in a second possible implementation manner, the calculating and reading the first data according to the third data and a value of a data flag corresponding to the third data specifically includes:

determining that the third data W and the value J of the data flag corresponding to the third data; and obtaining the first data W–($2^{N-T+1}-1$)*J by means of calculation.

With reference to the first aspect, or the first possible implementation manner or the second possible implementation manner of the first aspect, in a third possible implementation manner, the comparing data in the candidate data set with the second data, so as to acquire third data that is in the candidate data set and meets a preset rule specifically includes:

calculating a Hamming distance between the data in the candidate data set and the second data; and acquiring the third data whose Hamming distance to the second data is the shortest.

With reference to the first aspect, or any one of the first possible implementation manner to the third possible implementation manner of the first aspect, in a fourth possible implementation manner, the acquiring first data to be written into a storage device and an address for writing the first data includes:

receiving the first data and the address for the first data that are sent by a central processing unit CPU by using a bus.

With reference to the first aspect, or any one of the first possible implementation manner to the fourth possible implementation manner of the first aspect, in a fifth possible implementation manner, the storage device is a phase change memory PCM.

According to a second aspect, an embodiment of the present invention provides an apparatus for reading and writing data, including:

an interface adaptation unit, configured to acquire first data to be written into a storage device and an address for the first data, and acquire, according to the address, second data that has been written into the storage device;

a configuration interface unit, configured to acquire configuration information, where the configuration information includes a data bit width, a bit quantity of a data flag, and a preset stepping algorithm, and the data bit width indicates a bit width of the first data;

a calculating unit, configured to generate, according to the bit quantity of the data flag and the bit width of the first data and by using the preset stepping algorithm, a candidate data set corresponding to the first data, where each piece of data in the candidate data set is uniquely corresponding to a value of one data flag; and compare data in the candidate data set with the second data, so as to acquire third data that is in the candidate data set and meets a preset rule; and a read and write control unit, configured to write the third data into the storage device according to the address, so as to calculate and read the first data according to the third data and a value of a data flag corresponding to the third data, when the first data needs to be read.

In a first possible implementation manner of the second aspect, the calculating unit is specifically configured to determine the bit quantity T of the data flag and the bit width N of the first data; obtain a step $2^{N-T+1}-1$ by means of calculation according to the bit quantity T of the data flag and the bit width N of the first data, where N is a natural number, and T is a natural number; and generate the candidate data set corresponding to the first data, where the candidate data set is $M=\{m|m=U+(2^{N-T+1}-1)*I, I=[0, 2_T-1]\}$, U is the first data, and I indicates a value of the data flag.

With reference to the first possible implementation manner of the second aspect, in a second possible implementation manner, the apparatus for reading and writing data further includes:

a data restoring unit, configured to determine the third data W and the value J of the data flag corresponding to the third data; and obtain the first data $W-(2^{N-T+1}-1)*J$ by means of calculation.

With reference to the second aspect, or the first possible implementation manner or the second possible implementation manner of the second aspect, in a third possible implementation manner, the calculating unit is specifically configured to calculate a Hamming distance between the data in the candidate data set and the second data; and acquire the third data whose Hamming distance to the second data is the shortest.

With reference to the second aspect, or any one of the first possible implementation manner to the third possible implementation manner of the second aspect, in a fourth possible implementation manner, the interface adaptation unit is specifically configured to receive the first data and the address for the first data that are sent by a CPU by using a bus.

With reference to the second aspect, or any one of the first possible implementation manner to the fourth possible implementation manner of the second aspect, in a fifth possible implementation manner, the storage device is a PCM.

According to a third aspect, an embodiment of the present invention provides a system for reading and writing data, including:

an apparatus for reading and writing data, configured to acquire first data to be written into a storage device and an address for the first data; acquire, according to the address, second data that has been written into the storage device; acquire configuration information, where the configuration information includes a data bit width, a bit quantity of a data flag, and a preset stepping algorithm, and the data bit width indicates a bit width of the first data; generate, according to the bit quantity of the data flag and the bit width of the first data and by using the preset stepping algorithm, a candidate data set corresponding to the first data, where each piece of data in the candidate data set is uniquely corresponding to a value of one data flag; compare data in the candidate data set with the second data, so as to acquire third data that is in the candidate data set and meets a preset rule; and write the third data into the storage device according to the address, so as to calculate and read the first data according to the third data and a value of a data flag corresponding to the third data, when the first data needs to be read from the storage device; and the storage device, configured to store the third data.

In a first possible implementation manner of the third aspect, the apparatus for reading and writing data is specifically configured to determine the bit quantity T of the data flag and the bit width N of the first data; obtain a step $2^{N-T+1}-1$ by means of calculation according to the bit quantity T of the data flag and the bit width N of the first data, where N is a natural number, and T is a natural number; and generate the candidate data set corresponding to the first data, where the candidate data set is $M=\{m|m=U+(2^{N-T+1}-1)*I, I=[0, 2^T-1]\}$, U is the first data, and I indicates a value of the data flag.

With reference to the first possible implementation manner of the third aspect, in a second possible implementation manner, the apparatus for reading and writing data is specifically configured to determine the third data W and the value J of the data flag corresponding to the third data; and obtain the first data $W-(2^{N-T+1}-1)*J$ by means of calculation.

With reference to the third aspect, or the first possible implementation manner or the second possible implementation manner of the third aspect, in a third possible implementation manner, the apparatus for reading and writing data is specifically configured to calculate a Hamming distance between the data in the candidate data set and the second data; and acquire the third data whose Hamming distance to the second data is the shortest.

With reference to the third aspect, or any one of the first possible implementation manner to the third possible implementation manner of the third aspect, in a fourth possible implementation manner, the apparatus for reading and writing data is specifically configured to receive the first data and the address for the first data that are sent by a CPU by using a bus.

According to the method, apparatus, and system for reading and writing data provided in the embodiments of the present invention, first data to be written into a storage device and an address for the first data are acquired; second data that has been written into the storage device is acquired according to the address; configuration information is acquired, where the configuration information includes a data bit width, a bit quantity of a data flag, and a preset stepping algorithm, where the data bit width indicates a bit width of the first data; a candidate data set corresponding to the first data is generated according to the bit quantity of the data flag and the bit width of the first data and by using the preset stepping algorithm, where each piece of data in the candidate data set is uniquely corresponding to a value of one data flag; further, data in the candidate data set is compared with the second data, so as to acquire third data that is in the candidate data set and meets a preset rule; and the third data is written into the storage device according to the address, so as to calculate and read the first data according to the third data and a value of a data flag corresponding to the third data, when the first data needs to be read from the storage device. According to this solution, the candidate data set corresponding to the first data to be written into a storage device is generated by using the preset stepping algorithm; further, the third data that meets the preset condition is selected in the candidate data set and written into the storage device. Because the preset stepping algorithm can be used when bit quantities of the data flag are different, compared with the prior art, this solution resolves a problem in the prior art that different algorithms need to be configured for different bit quantities of the data flag, optimizes write operations of an apparatus for reading and writing data, and improves flexibility of the write operations on a storage device.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Embodiment 1

Figure 1:
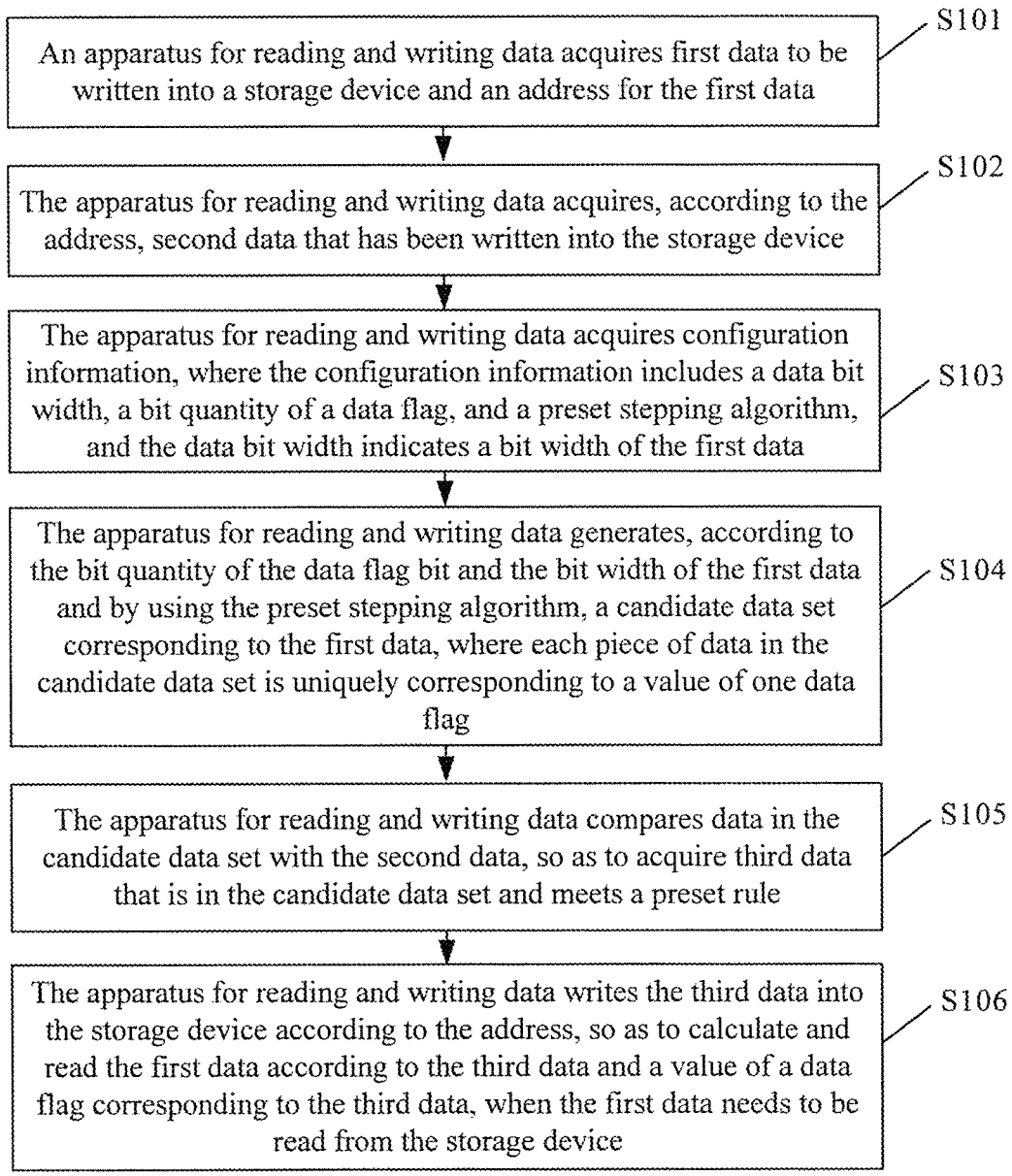
FIG. 1 is a first schematic flowchart of a method for reading and writing data according to the present invention.

As shown in FIG. 1, this embodiment of the present invention provides a method for reading and writing data, including the following steps.

S101. An apparatus for reading and writing data acquires first data to be written into a storage device and an address for the first data.

The storage device in this embodiment of the present invention may specifically be a storage device that supports bitwise access, such as a PCM. The PCM is a non-volatile memory whose operating principle is to store information by using a reversible phase change of a material (a same substance may exist in a state of solid, liquid, gas, condensate, plasma, or the like; all these states are called phases; the PCM stores information by using a resistance difference between different phases of a special material). The apparatus for reading and writing data in this embodiment of the present invention is based on an idea of a DCW method, uses a new stepping algorithm, and writes new data that is obtained by means of calculation into the storage device, which resolves a problem in the prior art that different algorithms need to be configured for write operations on storage devices of different optimization granularities.

The apparatus for reading and writing data receives the first data and the address for the first data that are sent by a CPU (Central Processing Unit, central processing unit) by using a bus, where the first data is data to be written into the storage device, the address is an address of a location at which the first data is to be written into the storage device, and the address is a physical address of the storage device. The bus herein refers to a common path used by the CPU, a memory, an input device, and an output device to transmit information. The first data and the address for the first data are transmitted by the CPU to the apparatus for reading and writing data by using the bus.

It can be easily understood by a person skilled in the art that the apparatus for reading and writing data in this embodiment of the present invention is an apparatus, which is configured to write data into the storage device, read data from the storage device, and communicate with the CPU.

S102. The apparatus for reading and writing data acquires, according to the address, second data that has been written into the storage device.

The apparatus for reading and writing data acquires, according to the address and from the storage device, the second data that has been written into the storage device.

S103. The apparatus for reading and writing data acquires configuration information, where the configuration information includes a data bit width, a bit quantity of a data flag, and a preset stepping algorithm, and the data bit width indicates a bit width of the first data.

The configuration information may be pre-stored in a configuration data unit in the apparatus for reading and writing data, and a configuration interface unit in the apparatus for reading and writing data acquires the configuration information from the configuration data unit, so that the configuration information can be used by the apparatus for reading and writing data when performing calculation of the stepping algorithm and data restoration. Specifically, how the configuration information is configured by the apparatus for reading and writing data is described in detail in subsequent embodiments.

S104. The apparatus for reading and writing data generates, according to the bit quantity of the data flag and the bit width of the first data and by using the preset stepping algorithm, a candidate data set corresponding to the first data, where each piece of data in the candidate data set is uniquely corresponding to a value of one data flag.

That the apparatus for reading and writing data generates, according to the bit quantity of the data flag and the bit width of the first data and by using the preset stepping algorithm, a candidate data set corresponding to the first data specifically includes the following: The apparatus for reading and writing data determines the bit quantity T of the data flag, and the bit width N of the first data; the apparatus for reading and writing data obtains a step $2^{N-T+1}-1$ by means of calculation according to the bit quantity T of the data flag and the bit width N of the first data, where N is a natural number, and T is a natural number; and the apparatus for reading and writing data generates the candidate data set corresponding to the first data, where the candidate data set is $M=\{m|m=U+(2^{N-T+1}-1)*I, I=[0, 2^T-1]\}$, U is the first data, and I indicates a value of the data flag.

Further, when S104 is being executed, the method for reading and writing data further includes the following: The apparatus for reading and writing data buffers the candidate data set, and a value of a data flag corresponding to each piece of data in the candidate data set.

To make the solutions of the present invention more clearly understood, this embodiment of the present invention is described by using an example in which first data to be written into a storage device is $(001)_2$, a bit width of the first data is three, and a bit quantity of a data flag is two. In this embodiment of the present invention, data that is enclosed in parentheses followed by a right subscript "2" indicates that the data is binary data.

In this case, $U=(001)_2$, $N=3$, $T=2$, and $S=2^{N-T+1}-1$.

(1) Calculate a step.

$S=2^{N-T+1}-1=2^{3-2+1}-1=3$.

(2) Generate a candidate data set.

A general formula that is met by data included in the candidate data set is $M=\{m|m=U+(2^{N-T+1}-1)*I, I=[0, 2^T-1]\}$, and the candidate data set corresponding to the first data is $\{(001)_2, (001)_2+3*1, (001)_2+3*2, (001)_2+3*3\}$, which is $\{(001)_2, (100)_2, (111)_2, (010)_2\}$ after being converted into binary numbers.

$I=[0, 2^T-1]$ means that I ranges from 0 to $2^T-1$ and includes the boundary values 0 and $2^T-1$.

It should be noted that calculation needs to be performed in a process of generating the candidate data set. Because $U=(001)_2$ is a binary number, $2^{N-T+1}-1$ and I are decimal numbers, for ease of understanding, in this embodiment of the present invention, when the values are substituted into the general formula, there are both binary numbers and decimal numbers, for example, $\{(001)_2, (001)_2+3*1, (001)_2+3*2, (001)_2+3*3\}$. However, in an actual calculation process, the first data may be converted into a decimal number and calculated with another parameter, and then the calculated result is converted into a binary number, for example, $(001)_2+3*1=1+3*1=4=(100)_2$. A person skilled in the art should learn, according to this method, how other data is obtained by calculation. Therefore, details are not described in subsequent embodiments again.

Figure 2:
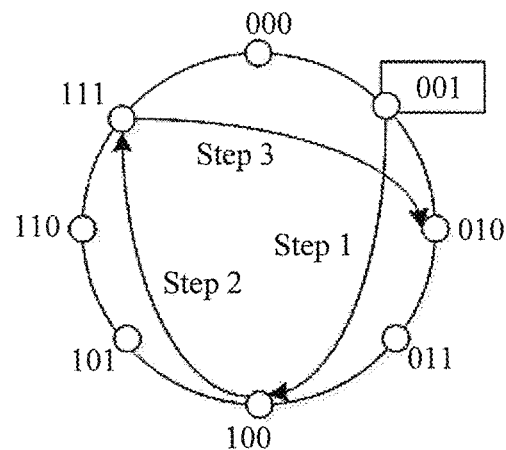
FIG. 2 is a first schematic structural diagram of a stepping method according to the present invention.

Further, it should be described that a core idea of the preset stepping algorithm proposed in this embodiment of the present invention is that: multiple pieces of data (including data for read and write operations) whose bit widths are the same as a bit width of the data for read and write operations are successively arranged and used as a whole data set, where the whole data set are successively arranged as a ring by connected a maximum value and a minimum value that are in the whole data set, so as to ensure that in the process of generating the candidate data set, stepped data are selected again starting from the minimum value after the maximum value is reached. To put it simply, as shown in FIG. 2, the first data is $U=(001)_2$, and the whole data set is all numbers that are successively arranged and whose bit widths are the same as the bit width of the first data, that is, $\{(000)_2, (001)_2, (010)_2, (011)_2, (100)_2, (101)_2, (110)_2, (111)_2\}$. A maximum value $(111)_2$ and a minimum value $(000)_2$ that are in the whole data set are connected to form a ring. On the ring of the whole data set, points are selected at a step of $S=2^{N-T+1}-1$, and $2^T$ pieces of data are selected to form the candidate data set (a quantity of data in the candidate data set is determined by the bit quantity of the data flag).

In this case, for the example in this embodiment of the present invention, starting from the first data $(001)_2$ (including the first data), a number is selected at a step of $S=2^{N-T+1}-1=2^{3-2+1}-1=3$. When stepped data reaches $(111)_2$ (the maximum value), a number is selected again from $(000)_2$ (the minimum value), and $2^2=4$ numbers are selected in total to form a candidate data set, so as to obtain the foregoing candidate data set $\{(001)_2, (100)_2, (111)_2, (010)_2\}$.

Further, it may be learned from the foregoing description that when T=N, a calculated step is one; when T=0, no candidate data set is generated.

It should be noted that this embodiment of the present invention imposes no limitation on a calculation formula of the preset stepping algorithm, and another formula may be used. A reason why $S=2^{N-T+1}-1$ is used in the present invention is to ensure that $2^T$ pieces of discrete and non-duplicate data can be generated. All the calculation formulas of the preset stepping algorithm, where the calculation formulas aim to generate a candidate data set and be applicable to different bit quantities of the data flag, shall fall within the protection scope of the embodiments of the present invention.

It may be learned from the foregoing preset stepping algorithm that the method for reading and writing data in this embodiment of the present invention can adapt to any bit quantity that is of the data flag and ranges from 0 to n. Therefore, there is no need to configure different algorithms according to different bit quantities of the data flag, which optimizes write operations of an apparatus for reading and writing data.

A time sequence among S102, S103, and S104 is not limited. That is, S102 may be executed before S103 and S104 are executed, or S103 and S104 may be executed before S102 is executed, or another execution sequence may be used, which is not limited in the present invention.

S105. The apparatus for reading and writing data compares data in the candidate data set with the second data, so as to acquire third data that is in the candidate data set and meets a preset rule.

Further, after generating the candidate data set, the apparatus for reading and writing data compares each data in the candidate data set with the second data, so as to acquire third data that is in the candidate data set and meets a preset rule. A specific method includes: calculating a Hamming distance between the data in the candidate data set and the second data; and acquiring the third data whose Hamming distance to the second data is the shortest.

A Hamming distance refers to a bit quantity of corresponding bits whose values are different between two code words. To put it simply, a Hamming distance refers to a quantity of bits with different coding at corresponding positions of two code words. For example, successively different bits between $(10101)_2$ and $(00110)_2$ include in the first bit, the fourth bit, and the fifth bit, therefore a Hamming distance between $(10101)_2$ and $(00110)_2$ is three.

Further, when calculating a Hamming distance between the data in the candidate data set and the second data, the method further includes: buffering the Hamming distance between the data in the candidate data set and the second data.

It should be noted that the method for reading and writing data in this embodiment of the present invention may use another algorithm to acquire the third data that is in the candidate data set and meets the preset rule. For example, to further reduce calculation times of the apparatus for reading and writing data, a threshold of the Hamming distance may be set, therefore there is no need to calculate Hamming distances between the second data and all data in the whole candidate data set. Only when the Hamming distance between calculated data and the second data meets the preset threshold for the first time, the data is written. Because the algorithms all aim to acquire the data whose difference with the second data is relatively small and write the data into the storage device, so as to achieve an effect that bit quantities of data that are changed during one write operation are reduced, the algorithms shall all fall within the protection scope of the embodiments of the present invention.

S106. The apparatus for reading and writing data writes the third data into the storage device according to the address, so as to calculate and read the first data according to the third data and a value of a data flag corresponding to the third data, when the first data needs to be read from the storage device.

The method for reading and writing data in this embodiment of the present invention is based on the DCW idea. In a process of writing the third data, only a bit that is changed, according to a result of comparing the third data with the second data, is written into the storage device.

Figure 3:
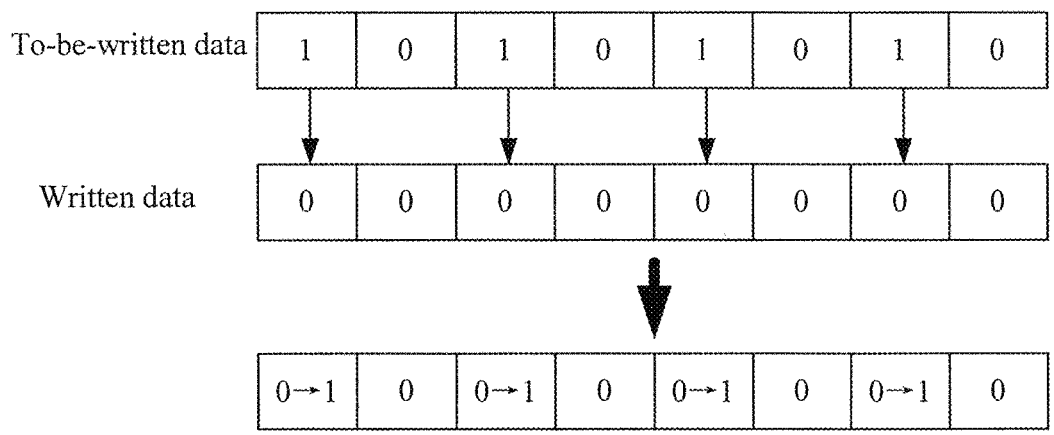
FIG. 3 is a schematic diagram of writing data based on a DCW idea according to the present invention.

For example, as shown in FIG. 3, if data to be written into the storage device is $(10101010)_2$ and data that has been written into the storage device is $(00000000)_2$, when the data that is to be written into the storage device is being written, only a data bit that is changed, according to a result of comparing the data to be written into the storage device with the data that has been written into the storage device, is written.

Specifically, that the apparatus for reading and writing data calculates and reads the first data according to the third data and a value of a data flag corresponding to the third data specifically includes: determining the third data W and the value J of the data flag corresponding to the third data; and obtaining the first data $W-(2^{N-T+1}-1)*J$ by means of calculation.

According to the method for reading and writing data provided in this embodiment of the present invention, first data to be written into a storage device and an address for the first data are acquired; second data that has been written into the storage device is acquired according to the address; configuration information is acquired, where the configuration information includes a data bit width, a bit quantity of a data flag, and a preset stepping algorithm, where the data bit width indicates a bit width of the first data; a candidate data set corresponding to the first data is generated according to the bit quantity of the data flag and the bit width of the first data and by using the preset stepping algorithm, where each piece of data in the candidate data set is uniquely corresponding to a value of one data flag; further, data in the candidate data set is compared with the second data, so as to acquire third data that is in the candidate data set and meets a preset rule; and the third data is written into the storage device according to the address, so as to calculate and read the first data according to the third data and a value of a data flag corresponding to the third data, when the first data needs to be read from the storage device. According to this solution, the candidate data set corresponding to the first data to be written into a storage device is generated by using the preset stepping algorithm; further, the third data that meets the preset condition is selected from the candidate data set and written into the storage device. Because the preset stepping algorithm can be used for write operations on storage devices of different optimization granularities, compared with the prior art, this solution resolves a problem in the prior art that different algorithms need to be configured for write operations on storage devices of different optimization granularities, optimizes write operations of an apparatus for reading and writing data, and improves flexibility of the write operations on a storage device.

Embodiment 2

Figure 4:
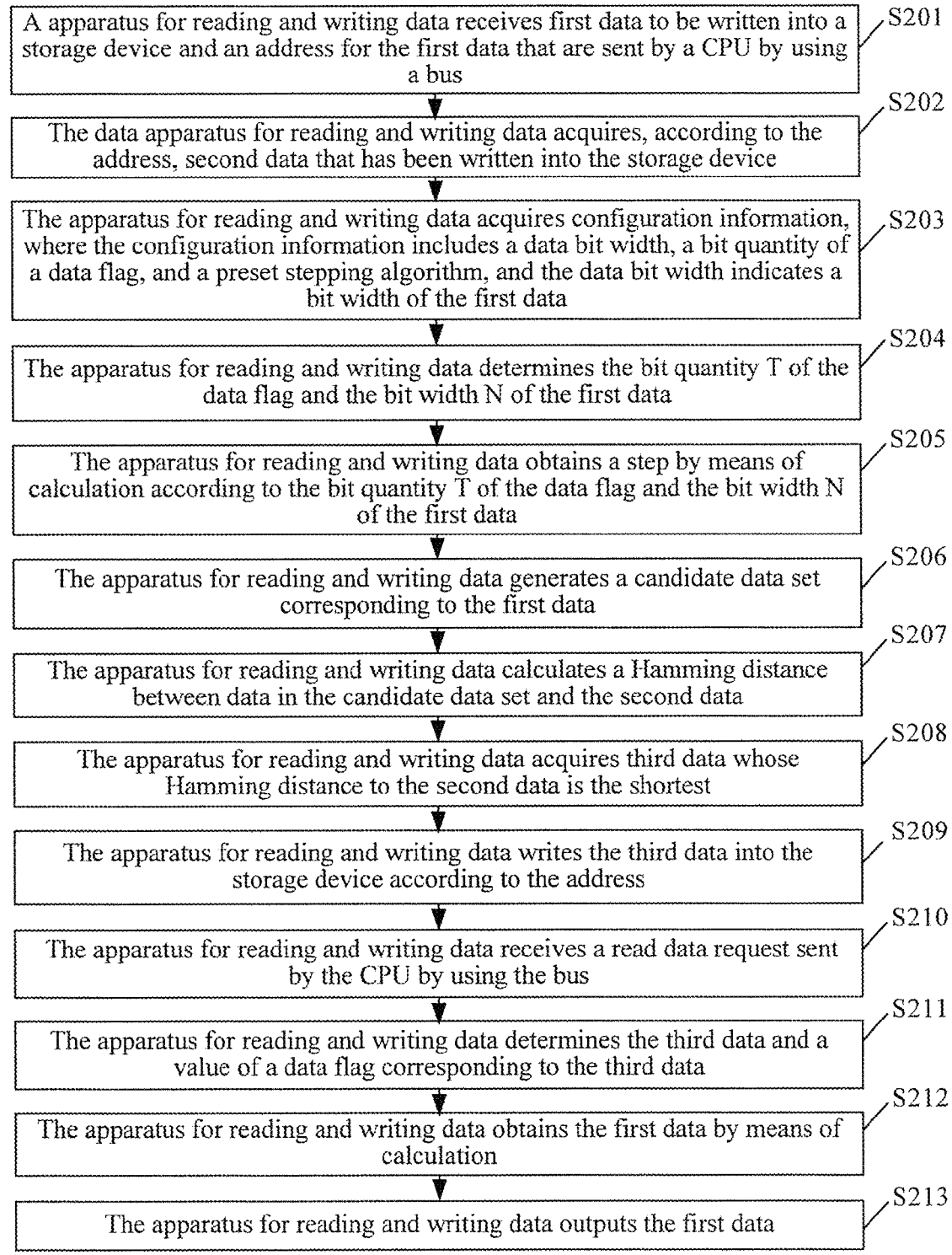
FIG. 4 is a second schematic flowchart of a method for reading and writing data according to the present invention.

This embodiment of the present invention provides a method for reading and writing data, as shown in FIG. 4. This embodiment of the present invention is described in detail by using an example in which first data to be written into a storage device is $U=(101110)_2$, a bit width of the first data that is indicated by configuration information is N=6, a bit quantity of a data flag that is indicated by configuration information is T=3, and second data that has been written into the storage device is $V=(001001)_2$. The method includes the following steps:

S201. An apparatus for reading and writing data receives first data to be written into a storage device and an address for the first data that are sent by a CPU by using a bus.

First, the apparatus for reading and writing data receives the first data $U=(101110)_2$ to be written into the storage device and the address for the first data $U=(101110)_2$ that are from the CPU.

The apparatus for reading and writing data in this embodiment of the present invention is an apparatus configured to write data into and read data from the storage device and communicate with the CPU.

Specifically, the storage device in this embodiment of the present invention may specifically be a PCM.

S202. The apparatus for reading and writing data acquires, according to the address, second data that has been written into the storage device.

The apparatus for reading and writing data reads, according to the received address and from the storage device, old data that has been written into the storage device, that is, the second data $V=(001001)_2$ in this embodiment of the present invention.

S203. The apparatus for reading and writing data acquires configuration information, where the configuration information includes a data bit width, a bit quantity of a data flag, and a preset stepping algorithm, and the data bit width indicates a bit width of the first data.

Specifically, the apparatus for reading and writing data acquires, from a configuration data unit in the apparatus for reading and writing data, the configuration information that includes the data bit width, the bit quantity of the data flag, and the preset stepping algorithm.

Further, a configuration process of the configuration information includes the following: The apparatus for reading and writing data receives a configuration request from the CPU, where the configuration request includes the data bit width, the bit quantity of the data flag, and the preset stepping algorithm; the apparatus for reading and writing data completes the corresponding configuration according to the configuration request and generates the configuration information.

The configuration of the configuration information in this embodiment of the present invention may include a fixed configuration method or a variable configuration method. The fixed configuration method is that: after the CPU sends the configuration request to the apparatus for reading and writing data, and the apparatus for reading and writing data completes the configuration, the CPU no longer sends another configuration request, and therefore, the data bit width and the like that are configured by the apparatus for reading and writing data are all fixed values, and bit widths of data that the CPU sends to the apparatus for reading and writing data are all fixed values. The variable configuration method is that: before sending data with a different bit width each time, the CPU sends the configuration request to the apparatus for reading and writing data, and therefore, the data bit width and the like that are configured by the apparatus for reading and writing data are variable values, which is not limited in the present invention.

S204. The apparatus for reading and writing data determines the bit quantity T of the data flag and the bit width N of the first data.

Specifically, the apparatus for reading and writing data determines the bit quantity T=3 of the data flag and the bit width N=6 of the first data $U=(101110)_2$ according to the configuration information.

In this embodiment of the present invention, the data flag refers to a data conversion step that is recorded in order that converted data can be restored to original data; the bit width of data refers to a bit quantity of binary data.

S205. The apparatus for reading and writing data obtains a step by means of calculation according to the bit quantity T of the data flag and the bit width N of the first data.

After determining $U=(101110)_2$, $N=6$, and $T=3$, the apparatus for reading and writing data obtains the step $S=2^{N-T+1}-1=2^{6-3+1}-1=15$ by means of calculation.

It should be noted that this embodiment of the present invention imposes no limitation on a calculation formula of the preset stepping algorithm, and another formula may be selected. Because the calculation formulas of the preset stepping algorithm all aim to be applicable to different bit quantities of the data flag at the same time when the candidate data set is generated, the calculation formulas shall all fall within the protection scope of the embodiments of the present invention.

S206. The apparatus for reading and writing data generates a candidate data set corresponding to the first data.

A general formula for selecting data into the candidate data set is $M=\{m|m=U+(2^{N-T+1}-1)*I, I=[0, 2^T-1]\}$, $U=(101110)_2$, $S=2^{N-T+1}-1=2^{6-3+1}-1=2^4-1=15$ and $I=\{0 \ldots (2^3-1)\}=\{0, 1, 2, 3, 4, 5, 6, 7\}$.

The candidate data set that is corresponding to the first data and is generated by the apparatus for reading and writing data is $\{(101110)_2, (101110)_2+15*1, (101110)_2+15*2, (101110)_2+15*3, (101110)_2+15*4, (101110)_2+15*5, (101110)_2+15*6, (101110)_2+15*7\}$ which is $\{(101110)_2, (111101)_2, (001100)_2, (011011)_2, (101010)_2, (111001)_2, (001000)_2, (010111)_2\}$ after being converted into binary numbers.

Figure 5:
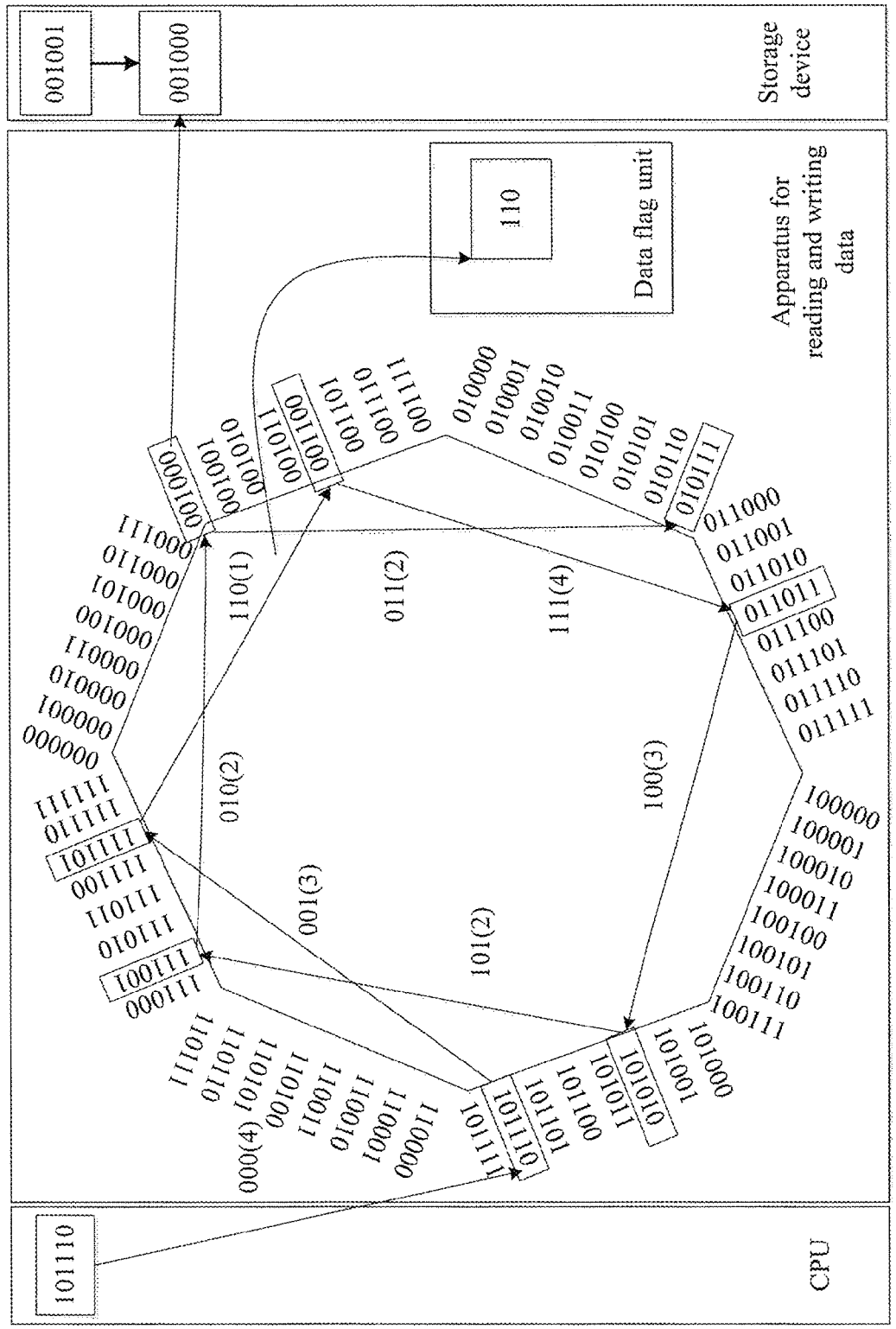
FIG. 5 is a second schematic structural diagram of a stepping method according to the present invention.

As shown in FIG. 5, after multiple pieces of data whose bit width is six are successively arranged as a ring, starting from $U=(101110)_2$, points are selected at a step of S=15, and the foregoing candidate data set is obtained. It should be noted that after the ring is formed, when the selected data reaches a maximum value, the next data is selected again starting from a minimum value. It may be learned from the example of this embodiment of the present invention, in a stepping process, after a selected data is $(111101)_2$, because the next data reaches the maximum value, stepping starts again from the minimum value, and the next data $(001100)_2$ is obtained.

Each piece of data in the generated candidate data set is uniquely corresponding to a value of one data flag. Specifically, still as shown in FIG. 5, the candidate data set in this embodiment of the present invention $\{(101110)_2, (111101)_2, (001100)_2, (011011)_2, (101010)_2, (111001)_2, (001000)_2, (010111)_2\}$ is respectively corresponding to values of the data flag $\{(000)_2, (001)_2, (010)_2, (011)_2, (100)_2, (101)_2, (110)_2, (111)_2\}$, which are $\{0, 1, 2, 3, 4, 5, 6, 7\}$ by converted into decimal numbers, and those are the foregoing I. When data is being written, a value of a data flag corresponding to the data is also stored, thereby when the data is being reading, obtaining real data (that is, the first data) by means of calculation according to the data and the value of the data flag corresponding to the data.

Further, it may be learned from the foregoing description that when T=N, a step S obtained by the foregoing calculation is one; when T=0, no candidate data set is generated.

Further, the apparatus for reading and writing data buffers the candidate data set corresponding to the first data and the value of the data flag corresponding to the data in the candidate data set into a calculation buffer unit.

S207. The apparatus for reading and writing data calculates a Hamming distance between the second data and data in the candidate data set.

Specifically, after generating the candidate data set $\{(101110)_2, (111101)_2, (001100)_2, (011011)_2, (101010)_2, (111001)_2, (001000)_2, (010111)_2\}$, the apparatus for reading and writing data calculates the Hamming distance between the second data $V=(001001)_2$ and each piece of data in the candidate data set.

A Hamming distance refers to a bit quantity of corresponding bits whose values are different between two code words. To put it simply, a Hamming distance refers to a quantity of bits with different coding at corresponding positions of two code words. For example, successively different bits between $(10101)_2$ and $(00110)_2$ include in the first bit, the fourth bit, and the fifth bit, therefore a Hamming distance between $(10101)_2$ and $(10101)_2$ is three.

Further, the apparatus for reading and writing data obtains by means of calculation that Hamming distances between the second data $V=(001001)_2$ and eight pieces of data in the candidate data set are respectively $\{4, 3, 2, 2, 3, 2, 1, 4\}$.

Further, the apparatus for reading and writing data buffers the Hamming distance between the second data and the data in the calculated candidate data set into the calculation buffer unit.

S208. The apparatus for reading and writing data acquires third data whose Hamming distance to the second data is the shortest.

Therefore, after obtaining by means of calculation the Hamming distances between the second data $V=^{(001001)_2}$ and the eight pieces of data in the candidate data set, the apparatus for reading and writing data selects the third data $W=^{(001000)_2}$ whose Hamming distance to the second data is the shortest, that is, corresponding data whose Hamming distance is one.

S209. The apparatus for reading and writing data writes the third data into the storage device according to the address.

In this embodiment of the present invention, the apparatus for reading and writing data writes the third data $W=^{(001000)_2}$ into the storage device indicated by the address, and stores, in a data flag it of the apparatus for reading and writing data, a value $^{(110)_2}$ of a data flag corresponding to $^{(001000)_2}$, or stores, in the storage device, a value $^{(110)_2}$ of a data flag corresponding to $^{(001000)_2}$.

It should be noted that in this embodiment of the present invention, a value of a data flag corresponding to data may be stored in the data flag unit of the apparatus for reading and writing data, or a unit in the storage device may be assigned to store a value of a data flag corresponding to data, so that the value can be used by the apparatus for reading and writing data, which is not limited in the present invention.

Till now, a data writing process is executed.

When the first data needs to be read, the method for reading and writing data further includes S210 to S213.

S210. The apparatus for reading and writing data receives a read data request sent by the CPU by using the bus.

The apparatus for reading and writing data receives, from the bus, the read data request that is sent by the CPU, where the read data request instructs to read the first data, and the read data request includes the address of the first data.

S211. The apparatus for reading and writing data determines the third data and a value of a data flag corresponding to the third data.

After receiving the read data request, the apparatus for reading and writing data determines, according to the address for the first data that is indicated by the read data request, the third data $W=^{(001000)_2}$ and the value $J=^{(110)_2}$ of the data flag corresponding to $^{(001000)_2}$.

S212. The apparatus for reading and writing data obtains the first data by means of calculation.

The third data is data that is obtained by converting the first data by using the preset stepping algorithm. Therefore, to acquire the first data, an inverse operation corresponding to the preset stepping algorithm needs to be performed, that is, the first data is $U=W-(2^{N-T+1}-1)*J=^{(001000)_2}-15*^{(110)_2}=^{(101110)_2}$.

S213. The apparatus for reading and writing data outputs the first data.

Finally, the apparatus for reading and writing data outputs the first data that is obtained by means of calculation to the CPU.

According to the method for reading and writing data provided in this embodiment of the present invention, first data to be written into a storage device and an address for the first data are acquired; second data that has been written into the storage device is acquired according to the address; configuration information is acquired, where the configuration information includes a data bit width, a bit quantity of a data flag, and a preset stepping algorithm, where the data bit width indicates a bit width of the first data; a candidate data set corresponding to the first data is generated according to the bit quantity of the data flag and the bit width of the first data and by using the preset stepping algorithm, where each piece of data in the candidate data set is uniquely corresponding to a value of one data flag; further, data in the candidate data set is compared with the second data, so as to acquire third data that is in the candidate data set and meets a preset rule; and the third data is written into the storage device according to the address, so as to calculate and read the first data according to the third data and a value of a data flag corresponding to the third data, when the first data needs to be read from the storage device. According to this solution, the candidate data set corresponding to the first data to be written into a storage device is generated by using the preset stepping algorithm; further, the third data that meets the preset condition is selected from the candidate data set and written into the storage device. Because the preset stepping algorithm can be used for write operations on storage devices of different optimization granularities, compared with the prior art, this solution resolves a problem in the prior art that different algorithms need to be configured for write operations on storage devices of different optimization granularities, optimizes write operations of an apparatus for reading and writing data, and improves flexibility of the write operations on a storage device.

Embodiment 3

Figure 6:
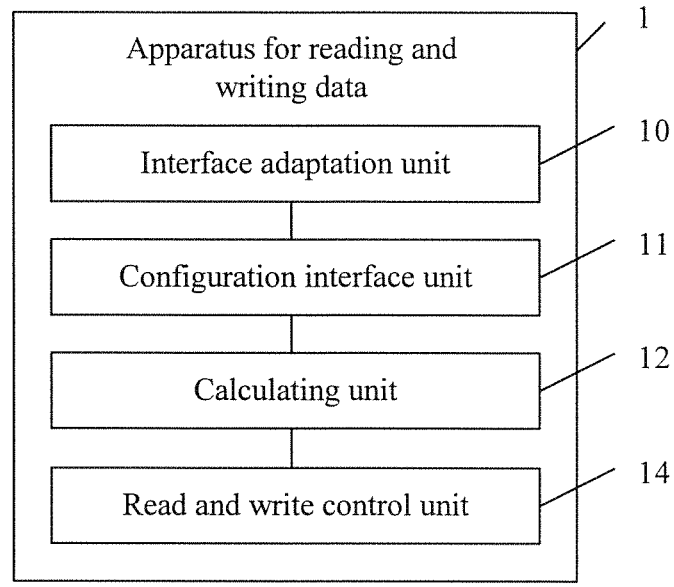
FIG. 6 is a first schematic structural diagram of an apparatus for reading and writing data according to the present invention.

As shown in FIG. 6, this embodiment of the present invention provides an apparatus for reading and writing data 1, including:

an interface adaptation unit 10, configured to acquire first data to be written into a storage device and an address for the first data, and acquire, according to the address, second data that has been written into the storage device;

a configuration interface unit 11, configured to acquire configuration information, where the configuration information includes a data bit width, a bit quantity of a data flag, and a preset stepping algorithm, and the data bit width indicates a bit width of the first data;

a calculating unit 12, configured to generate, according to the bit quantity of the data flag and the bit width of the first data and by using the preset stepping algorithm, a candidate data set corresponding to the first data, where each piece of data in the candidate data set is uniquely corresponding to a value of one data flag; and compare data in the candidate data set with the second data, so as to acquire third data that is in the candidate data set and meets a preset rule; and a read and write control unit 14, configured to write the third data into the storage device according to the address, so as to calculate and read the first data according to the third data and a value of a data flag corresponding to the third data, when the first data needs to be read.

Further, the calculating unit 12 is specifically configured to determine the bit quantity T of the data flag and the bit width N of the first data; obtain a step $2^{N-T+1}-1$ by means of calculation according to the bit quantity T of the data flag and the bit width N of the first data, where N is a natural number, and T is a natural number; and generate the candidate data set corresponding to the first data, where the candidate data set is $M=\{m|m=U+(2^{N-T+1}-1)*I, I=[0, 2^T-1]\}$, U is the first data, and I indicates a value of the data flag.

Figure 7:
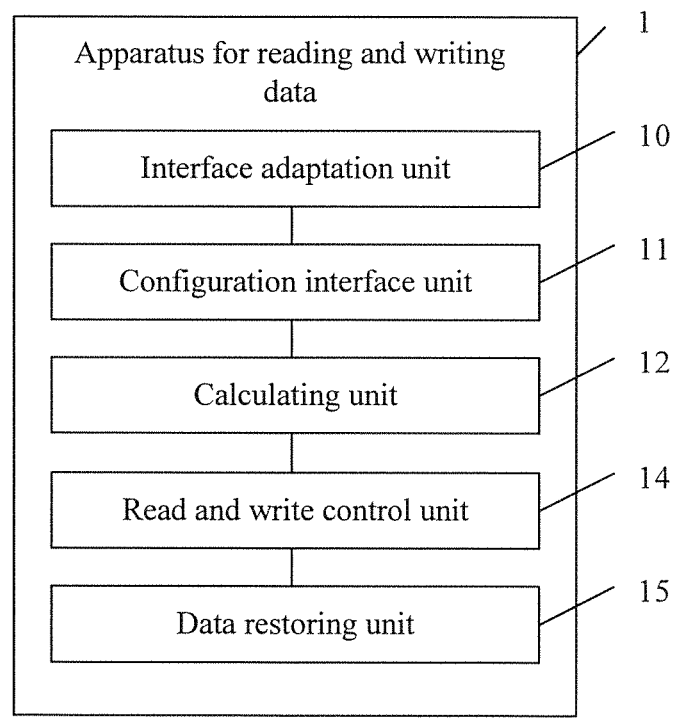
FIG. 7 is a second schematic structural diagram of an apparatus for reading and writing data according to the present invention.

Further, as shown in FIG. 7, the apparatus for reading and writing data 1 further includes:

a data restoring unit 15, configured to determine the third data W and the value J of the data flag corresponding to the third data; and obtain the first data $W-(2^{N-T+1}-1)*J$ by means of calculation.

Further, the calculating unit 12 is specifically configured to calculate a Hamming distance between the data in the candidate data set and the second data; and acquire the third data whose Hamming distance to the second data is the shortest.

Further, the interface adaptation unit 10 is specifically configured to receive the first data and the address for the first data that are sent by a CPU by using a bus.

Further, the storage device is a PCM.

According to the apparatus for reading and writing data provided in this embodiment of the present invention, first data to be written into a storage device and an address for the first data are acquired; second data that has been written into the storage device is acquired according to the address; configuration information is acquired, where the configuration information includes a data bit width, a bit quantity of a data flag, and a preset stepping algorithm, where the data bit width indicates a bit width of the first data; a candidate data set corresponding to the first data is generated according to the bit quantity of the data flag and the bit width of the first data and by using the preset stepping algorithm, where each piece of data in the candidate data set is uniquely corresponding to a value of one data flag; further, data in the candidate data set is compared with the second data, so as to acquire third data that is in the candidate data set and meets a preset rule; and the third data is written into the storage device according to the address, so as to calculate and read the first data according to the third data and a value of a data flag corresponding to the third data, when the first data needs to be read from the storage device. According to this solution, the candidate data set corresponding to the first data to be written into a storage device is generated by using the preset stepping algorithm; further, the third data that meets the preset condition is selected from the candidate data set and written into the storage device. Because the preset stepping algorithm can be used for write operations on storage devices of different optimization granularities, compared with the prior art, this solution resolves a problem in the prior art that different algorithms need to be configured for write operations on storage devices of different optimization granularities, optimizes write operations of an apparatus for reading and writing data, and improves flexibility of the write operations on a storage device.

Embodiment 4

Figure 8:
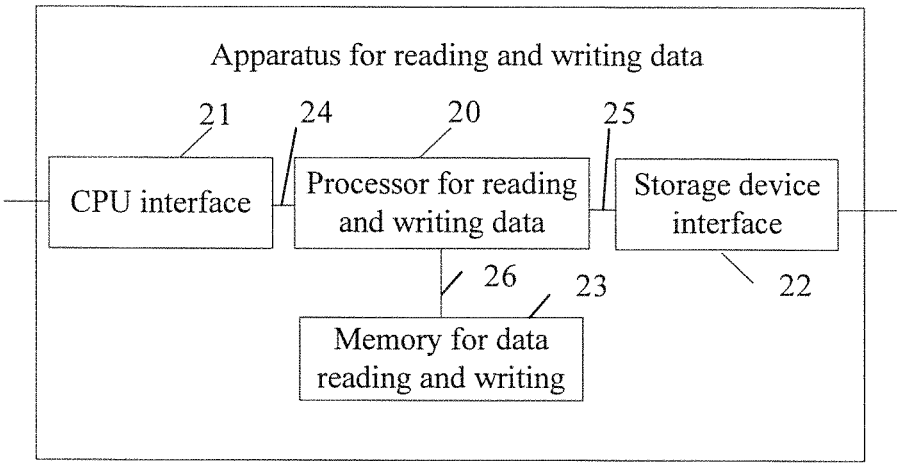
FIG. 8 is a third schematic structural diagram of an apparatus for reading and writing data according to the present invention.

As shown in FIG. 8, this embodiment of the present invention provides an apparatus for reading and writing data. The apparatus for reading and writing data includes: at least one processor 20 for reading and writing data, at least one CPU interface 21, and at least one storage device interface 22, where the at least one CPU interface 21 is configured to exchange data with a CPU, and the at least one storage device interface 22 is configured to exchange data with a storage device; at least one memory 23 for data reading and writing; and a first communications bus 24 between the CPU interface 21 and the processor 20 for reading and writing data, a second communications bus 25 between the processor 20 for reading and writing data and the storage device interface 22, and a third communications bus 26 between the processor 20 for reading and writing data and the memory 23 for data reading and writing, where the first communications bus 24, the second communications bus 25, and the third communications bus 26 are configured to implement connection and communication between these components. The memory 23 for data reading and writing may include a high-speed RAM (Random Access Memory, random access memory) or may further include a non-volatile memory (non-volatile memory)

Specifically, the processor 20 is configured to acquire first data to be written into the storage device and an address for the first data; acquire, according to the address, second data that has been written into the storage device; acquire configuration information, where the configuration information includes a data bit width, a bit quantity of a data flag, and a preset stepping algorithm, and the data bit width indicates a bit width of the first data; generate, according to the bit quantity of the data flag and the bit width of the first data and by using the preset stepping algorithm, a candidate data set corresponding to the first data, where each piece of data in the candidate data set is uniquely corresponding to a value of one data flag; compare data in the candidate data set with the second data, so as to acquire third data that is in the candidate data set and meets a preset rule; and write the third data into the storage device according to the address, so as to calculate and read the first data according to the third data and a value of a data flag corresponding to the third data, when the first data needs to be read from the storage device.

The memory 23 for data reading and writing is configured to store the data in the generated candidate data set, and a Hamming distance that is between the second data and the data in the candidate data set and is generated in a calculation process.

If the apparatus for reading and writing data needs to store a value of the data flag, further a high-speed memory configured to store the value of the data flag needs to be disposed in the apparatus for reading and writing data.

Further, the processor 20 is specifically configured to determine the bit quantity T of the data flag, and the bit width N of the first data; obtain a step $2^{N-T+1}-1$ by means of calculation according to the bit quantity T of the data flag and the bit width N of the first data, where N is a natural number, and T is a natural number; and generate the candidate data set corresponding to the first data, where the candidate data set is $M=\{m|m=U+(2^{N-T+1}-1)*I, I=[0, 2^T-1]\}$, U is the first data, and I indicates a value of the data flag.

Further, the processor 20 is specifically configured to calculate the Hamming distance between the data in the candidate data set and the second data; and acquire the third data whose Hamming distance to the second data is the shortest.

Further, the processor 20 is specifically configured to determine the third data W, and the value J of the data flag corresponding to the third data; and obtain the first data $W-(2^{N-T+1}-1)*J$ by means of calculation.

According to the apparatus for reading and writing data provided in this embodiment of the present invention, first data to be written into a storage device and an address for the first data are acquired; second data that has been written into the storage device is acquired according to the address; configuration information is acquired, where the configuration information includes a data bit width, a bit quantity of a data flag, and a preset stepping algorithm, where the data bit width indicates a bit width of the first data; a candidate data set corresponding to the first data is generated according to the bit quantity of the data flag and the bit width of the first data and by using the preset stepping algorithm, where each piece of data in the candidate data set is uniquely corresponding to a value of one data flag; further, data in the candidate data set is compared with the second data, so as to acquire third data that is in the candidate data set and meets a preset rule; and the third data is written into the storage device according to the address, so as to calculate and read the first data according to the third data and a value of a data flag corresponding to the third data, when the first data needs to be read from the storage device. According to this solution, the candidate data set corresponding to the first data to be written into a storage device is generated by using the preset stepping algorithm; further, the third data that meets the preset condition is selected from the candidate data set and written into the storage device. Because the preset stepping algorithm can be used for write operations on storage devices of different optimization granularities, compared with the prior art, this solution resolves a problem in the prior art that different algorithms need to be configured for write operations on storage devices of different optimization granularities, optimizes write operations of an apparatus for reading and writing data, and improves flexibility of the write operations on a storage device.

Embodiment 5

This embodiment of the present invention provides a system for reading and writing data, including:

an apparatus for reading and writing data, configured to acquire first data to be written into a storage device and an address for the first data; acquire, according to the address, second data that has been written into the storage device; acquire configuration information, where the configuration information includes a data bit width, a bit quantity of a data flag, and a preset stepping algorithm, and the data bit width indicates a bit width of the first data; generate, according to the bit quantity of the data flag and the bit width of the first data and by using the preset stepping algorithm, a candidate data set corresponding to the first data, where each piece of data in the candidate data set is uniquely corresponding to a value of one data flag; compare data in the candidate data set with the second data, so as to acquire third data that is in the candidate data set and meets a preset rule; and write the third data into the storage device according to the address, so as to calculate and read the first data according to the third data and a value of a data flag corresponding to the third data, when the first data needs to be read from the storage device; and the storage device, configured to store the third data.

Further, the apparatus for reading and writing data is specifically configured to determine the bit quantity T of the data flag and the bit width N of the first data; obtain a step $2^{N-T+1}-1$ by means of calculation according to the bit quantity T of the data flag and the bit width N of the first data, where N is a natural number, and T is a natural number; and generate the candidate data set corresponding to the first data, where the candidate data set is $M=\{m|m=U+(2^{N-T+1}-1)*I, I=[0, 2^{T}-1]\}$, U is the first data, and I indicates a value of the data flag.

Further, the apparatus for reading and writing data is specifically configured to determine the third data W and the value J of the data flag corresponding to the third data; and obtain the first data $W-(2^{N-T+1}-1)*J$ by means of calculation.

Further, the apparatus for reading and writing data is specifically configured to calculate a Hamming distance between the data in the candidate data set and the second data; and acquire the third data whose Hamming distance to the second data is the shortest.

Further, the apparatus for reading and writing data is specifically configured to receive the first data and the address for the first data that are sent by a CPU by using a bus.

Figure 9:
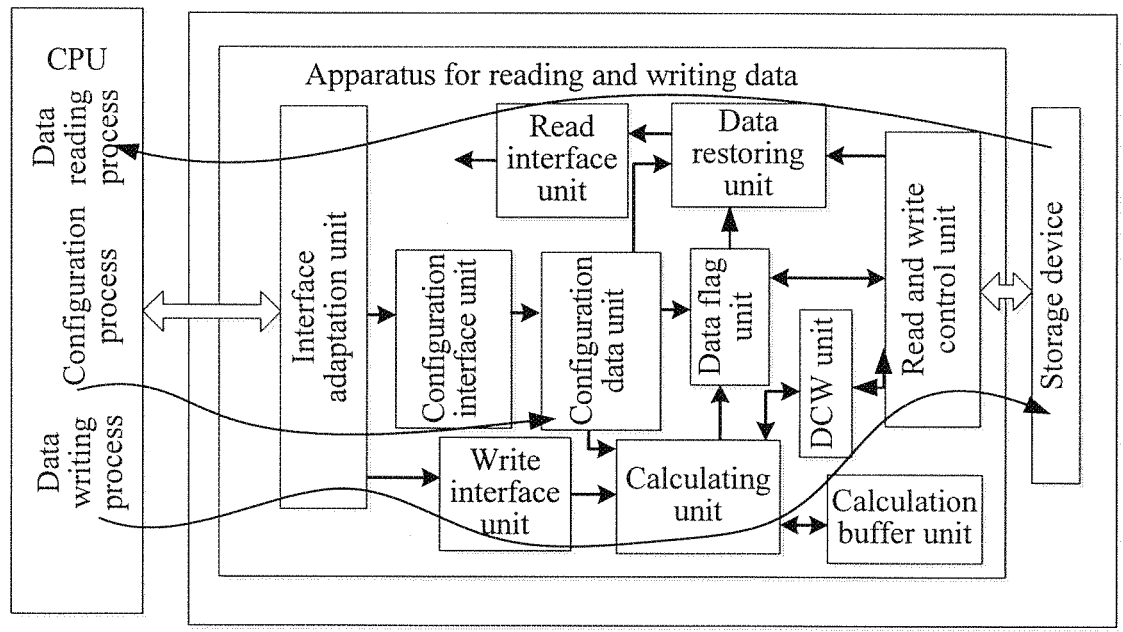
FIG. 9 is a schematic structural diagram of a system for reading and writing data according to the present invention.

In conclusion, a structural diagram of the system for reading and writing data is shown in FIG. 9. As shown by curved arrows in FIG. 9, a method for reading and writing data may specifically include a configuration process, a data writing process, and a data reading process.

(1) Configuration Process

The CPU transmits the configuration information to an interface adaptation unit in the apparatus for reading and writing data by using the bus, and then the interface adaptation unit transmits the configuration information to a configuration interface unit. In this case, the configuration interface unit may buffer the configuration information into a configuration data unit, so that the configuration information can be used by another unit, where the configuration information includes the data bit width, the bit quantity of the data flag, and the preset stepping algorithm. Till now, the configuration process of the method for reading and writing data in this embodiment of the present invention is executed.

(2) Data Writing Process

When data needs to be written, the CPU transmits, to the interface adaptation unit in the apparatus for reading and writing data and by using the bus, the first data to be written into the apparatus for reading and writing data and the address for the first data. The interface adaptation unit acquires the written second data from the storage device according to the address. Then the configuration interface unit transmits the first data and the second data to a calculating unit by using a write interface unit. After receiving the first data, the calculating unit acquires, from the foregoing configuration data unit of the buffered configuration information, the bit quantity of the data flag and the preset stepping algorithm, and generates, according to the bit quantity of the data flag and the bit width of the first data and by using the preset stepping algorithm, the candidate data set corresponding to the first data, where each piece of data in the candidate data set is uniquely corresponding to a value of one data flag. After generating the candidate data set, the calculating unit compares the data in the candidate data set with the second data, so as to acquire the third data whose Hamming distance to the second data is the shortest in the candidate data set. In this process, the calculating unit may buffer the generated candidate data set and the Hamming distance between the second data and each piece of data in the candidate data set into a calculation buffer unit and buffer a value of a data flag of each piece of data into the calculation buffer unit. The calculating unit transmits the obtained third data to a read and write control unit by using a DOW unit. The read and write control unit writes the third data into the storage device, and stores the value of data flag corresponding to the third data in a data flag unit, or stores the value of data flag corresponding to the third data in the storage device. Till now, the data writing process of the method for reading and writing data in this embodiment of the present invention is executed.

(3) Data Reading Process

When data needs to be read, the CPU sends a read data request to the interface adaptation unit, where the read data request may include the address for the first data that needs to be read. The interface adaptation unit transmits the read data request to a data restoring unit by using a read interface unit. The data restoring unit acquires the third data from the storage device according to the address, acquires, from the data flag unit, the value of the data flag corresponding to the third data, and acquires the preset stepping algorithm from the configuration data unit. The data restoring unit restores the first data according to the third data and the value of the data flag corresponding to the third data by performing an inverse operation of the preset stepping algorithm. The data restoring unit transmits the first data to the interface adaptation unit by using the read interface unit. The interface adaptation unit transmits the first data to the CPU by using the bus. Till now, the data reading process of the method for reading and writing data in this embodiment of the present invention is executed.

According to the system for reading and writing data provided in this embodiment of the present invention, an apparatus for reading and writing data acquires first data to be written into a storage device and an address for the first data; acquires second data that has been written into the storage device according to the address; after acquiring configuration information, where the configuration information includes a data bit width, a bit quantity of a data flag, and a preset stepping algorithm, and the data bit width indicates a bit width of the first data, generates a candidate data set corresponding to the first data according to the bit quantity of the data flag and the bit width of the first data and by using the preset stepping algorithm, where each piece of data in the candidate data set is uniquely corresponding to a value of one data flag; further, compares data in the candidate data set with the second data, so as to acquire third data that is in the candidate data set and meets a preset rule; and writes the third data into the storage device according to the address, so as to calculate and read the first data according to the third data and a value of a data flag corresponding to the third data, when the first data needs to be read from the storage device. According to this solution, the candidate data set corresponding to the first data to be written into a storage device is generated by using the preset stepping algorithm; further, the third data that meets the preset condition is selected from the candidate data set and written into the storage device. Because the preset stepping algorithm can be used for write operations on storage devices of different optimization granularities, compared with the prior art, this solution resolves a problem in the prior art that different algorithms need to be configured for write operations on storage devices of different optimization granularities, optimizes write operations of an apparatus for reading and writing data, and improves flexibility of the write operations on a storage device.

A person of ordinary skill in the art may understand that all or some of the steps of the method embodiments may be implemented by a program instructing relevant hardware. The program may be stored in a computer readable storage medium. When the program runs, the steps of the method embodiments are performed. The foregoing storage medium includes: any medium that can store program code, such as a ROM, a RAM, a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method for reading and writing data, the method comprising:
    acquiring first data to be written into a storage device and an address for the first data;
    acquiring, according to the address, second data that has been written into the storage device;
    acquiring configuration information, wherein the configuration information comprises a data bit width, a bit quantity of a data flag, and a preset stepping algorithm, and the data bit width indicates a bit width of the first data;
    generating, according to the bit quantity of the data flag and the bit width of the first data and by using the preset stepping algorithm, a candidate data set corresponding to the first data, wherein each piece of data in the candidate data set is uniquely corresponding to a value of one data flag;
    comparing data in the candidate data set with the second data, so as to acquire third data that is in the candidate data set and meets a preset rule; and
    writing the third data into the storage device according to the address, so as to calculate and read the first data according to the third data and a value of a data flag corresponding to the third data, when the first data needs to be read from the storage device.

2. The method according to claim 1, wherein generating, according to the bit quantity of the data flag and the bit width of the first data and by using the preset stepping algorithm, a candidate data set corresponding to the first data comprises:
    determining the bit quantity T of the data flag and the bit width N of the first data;
    obtaining a step $2^{N-T+1}-1$ by means of calculation according to the bit quantity T of the data flag and the bit width N of the first data, wherein N is a natural number, and T is a natural number; and
    generating the candidate data set corresponding to the first data, wherein the candidate data set is $M=\{m|m=U+(2^{N-T+1}-1)*I, I=[0, 2^T-1]\}$, U is the first data, and I indicates a value of the data flag.

3. The method according to claim 2, wherein calculating and reading the first data according to the third data and a value of a data flag corresponding to the third data comprises:
    determining the third data W and the value J of the data flag corresponding to the third data; and
    obtaining the first data $W-(2^{N-T+1}-1)*J$ by means of calculation.

4. The method according to claim 1, wherein comparing data in the candidate data set with the second data, so as to acquire third data that is in the candidate data set and meets a preset rule comprises:
    calculating a Hamming distance between the data in the candidate data set and the second data; and
    acquiring the third data whose Hamming distance to the second data is the shortest.

5. The method according to claim 1, wherein acquiring first data to be written into a storage device and an address for writing the first data comprises:
    receiving the first data and the address for the first data that are sent by a central processing unit (CPU) by using a bus.

6. The method according to claim 1, wherein the storage device is a phase change memory (PCM).

7. An apparatus for reading and writing data, the apparatus comprising:
    a processor;
    a storage device interface connected to the processor by a communications bus, the storage device interface configured to exchange data between the processor and a storage device; and
    wherein the processor is configured to:
        acquire first data to be written into the storage device and an address for the first data, acquire, by the storage device interface and according to the address, second data that has been written into the storage device, acquire configuration information, wherein the configuration information includes a data bit width, a bit quantity of a data flag, and a preset stepping algorithm, and the data bit width indicates a bit width of the first data, generate, according to the bit quantity of the data flag and the bit width of the first data and by using the preset stepping algorithm, a candidate data set corresponding to the first data, wherein each piece of data in the candidate data set is uniquely corresponding to a value of one data flag, compare data in the candidate data set with the second data, so as to acquire third data that is in the candidate data set and meets a preset rule, and write, by the storage device interface and according to the address, the third data into the storage device, so as to calculate and read the first data according to the third data and a value of a data flag corresponding to the third data, when the first data needs to be read from the storage device.

8. The apparatus according to claim 7, wherein the processor is configured to:

determine the bit quantity T of the data flag and the bit width N of the first data; and obtain a step $2^{N-T+1}-1$ by means of calculation according to the bit quantity T of the data flag and the bit width N of the first data, wherein N is a natural number, and T is a natural number; and generate the candidate data set corresponding to the first data, wherein the candidate data set is M={m|m=U+($2^{N-T+1}-1$)*I, I=[0, $2^T-1$]}, U is the first data, and I indicates a value of the data flag.

9. The apparatus according to claim 8, wherein the processor is configured to:

determine the third data W and the value J of the data flag corresponding to the third data; and obtain the first data W−($2^{N-T+1}-1$)*J by means of calculation.

10. The apparatus according to claim 7, wherein the processor is configured to:

calculate a Hamming distance between the data in the candidate data set and the second data; and acquire the third data whose Hamming distance to the second data is the shortest.

11. The apparatus according to claim 7, further comprising:

a central processing unit (CPU) interface connected to the processor by a communications bus, wherein the CPU interface is configured to exchange data between the processor and a CPU; and wherein the processor is configured to receive, by the CPU interface, the first data and the address for the first data, which are sent by the CPU.

12. The apparatus according to claim 7, wherein the storage device is a phase change memory (PCM).

13. A system for reading and writing data, the system comprising:

an apparatus for reading and writing data, the apparatus configured to:

acquire first data to be written into a storage device and an address for the first data, acquire, according to the address, second data that has been written into the storage device, acquire configuration information, wherein the configuration information comprises a data bit width, a bit quantity of a data flag, and a preset stepping algorithm, and the data bit width indicates a bit width of the first data, generate, according to the bit quantity of the data flag and the bit width of the first data and by using the preset stepping algorithm, a candidate data set corresponding to the first data, wherein each piece of data in the candidate data set is uniquely corresponding to a value of one data flag, compare data in the candidate data set with the second data, so as to acquire third data that is in the candidate data set and meets a preset rule, and write the third data into the storage device according to the address, so as to calculate and read the first data according to the third data and a value of a data flag corresponding to the third data, when the first data needs to be read from the storage device; and wherein the storage device is configured to store data.

14. The system according to claim 13, wherein the apparatus is configured to:

determine the bit quantity T of the data flag, and the bit width N of the first data;

obtain a step $2^{N-T+1}-1$ by means of calculation according to the bit quantity T of the data flag and the bit width N of the first data, wherein N is a natural number, and T is a natural number; and generate the candidate data set corresponding to the first data, wherein the candidate data set is M={m|m=U+($2^{N-T+1}-1$)*I, I=[0, $2^T-1$]}, U is the first data, and I indicates a value of the data flag.

15. The system according to claim 14, wherein the apparatus is configured to:

determine the third data W and the value J of the data flag corresponding to the third data; and obtain the first data W−($2^{N-T+1}-1$)*J by means of calculation.

16. The system according to claim 13, wherein the apparatus is configured to:

calculate a Hamming distance between the data in the candidate data set and the second data; and acquire the third data whose Hamming distance to the second data is the shortest.

17. The system according to claim 16, wherein the apparatus further comprises:

a processor; and a memory connected to the processor by a communications bus, wherein the memory is configured to:

store the data in the generated candidate data set, and store the Hamming distance that is between the second data and the data in the candidate data set and is generated in a calculation process.

18. The system according to claim 13, wherein the apparatus is configured to receive the first data and the address for the first data sent by a central processing unit (CPU) by using a bus.

* * * * *